(12) United States Patent
Zhang et al.

(10) Patent No.: US 12,032,841 B2
(45) Date of Patent: Jul. 9, 2024

(54) MEMORY COUPLED COMPILING METHOD AND SYSTEM OF RECONFIGURABLE CHIP

(71) Applicant: Beijing Tsingmicro Intelligent Technology Co., Ltd., Beijing (CN)

(72) Inventors: Zhen Zhang, Beijing (CN); Peng Ouyang, Beijing (CN); Junbao Hu, Beijing (CN)

(73) Assignee: BEIJING TSINGMICRO INTELLIGENT TECHNOLOGY CO., LTD., Beijing (CN)

( * ) Notice: Subject to any disclaimer, the term of this patent is extended or adjusted under 35 U.S.C. 154(b) by 377 days.

(21) Appl. No.: 17/484,408

(22) Filed: Sep. 24, 2021

(65) Prior Publication Data

US 2022/0206697 A1 Jun. 30, 2022

Related U.S. Application Data

(63) Continuation of application No. PCT/CN2021/078941, filed on Mar. 3, 2021.

(30) Foreign Application Priority Data

Dec. 24, 2020 (CN) .......................... 202011554667.8

(51) Int. Cl.
*G06F 3/06* (2006.01)
*G06F 8/41* (2018.01)
*G06F 9/50* (2006.01)

(52) U.S. Cl.
CPC .......... *G06F 3/0635* (2013.01); *G06F 3/0604* (2013.01); *G06F 3/0673* (2013.01);
(Continued)

(58) Field of Classification Search
CPC .... G06F 3/0604; G06F 3/0635; G06F 3/0673; G06F 8/41; G06F 8/433; G06F 8/451;
(Continued)

(56) References Cited

U.S. PATENT DOCUMENTS 7,565,631 B1 * 7/2009 Banerjee ................. G06F 30/30
716/132
9,218,443 B1 * 12/2015 Styles ..................... G06F 8/451
(Continued)

OTHER PUBLICATIONS

Joao M.P. Cardoso, "Compiling for Reconfigurable Computing: A Survey", published by ACM, ACM Computing Surveys, vol. 42, No. 4, Article 13, Publication date: Jun. 2010, pp. 13:1-13:65 (Year: 2010).*

(Continued)

*Primary Examiner* — S. Sough
*Assistant Examiner* — Zheng Wei
(74) *Attorney, Agent, or Firm* — Hodgson Russ LLP

(57) ABSTRACT

Provided are a memory coupled compiling method and system of a reconfigurable chip. The memory coupled compiling method includes: acquiring a cycle number of a data flow graph (DFG); acquiring a linear transformation vector of the cycle number through a mapping time difference; determining whether a linear array of the linear transformation vector is acquired by a heuristic algorithm; acquiring a memory mapping result through a current DFG or acquiring a cycle number of the current DFG until the linear array is acquired, depending on the determination result.

18 Claims, 3 Drawing Sheets

(52) U.S. Cl.
CPC ............ *G06F 8/433* (2013.01); *G06F 9/5066* (2013.01); *G06F 8/451* (2013.01)

(58) Field of Classification Search
CPC ..... G06F 9/5066; G06F 9/54; G06F 8/445–47
See application file for complete search history.

(56) References Cited

U.S. PATENT DOCUMENTS

| | | | | |
|---|---|---|---|---|
| 10,037,198 | B2* | 7/2018 | Stanfill | ............ G06F 8/456 |
| 10,409,966 | B2* | 9/2019 | Gu | ............ G06F 8/41 |
| 2002/0013937 | A1* | 1/2002 | Ostanevich | ............ G06F 8/4441 |
| | | | | 717/160 |
| 2005/0144581 | A1* | 6/2005 | Imai | ............ G06F 30/30 |
| | | | | 716/105 |
| 2012/0084067 | A1* | 4/2012 | Ispir | ............ G06F 30/327 |
| | | | | 703/14 |
| 2012/0110561 | A1* | 5/2012 | Lai | ............ G06F 8/4442 |
| | | | | 717/151 |
| 2016/0246602 | A1* | 8/2016 | Radhika | ............ G06F 9/3853 |
| 2021/0144581 | A1* | 5/2021 | Tripathi | ............ H04W 48/12 |

OTHER PUBLICATIONS

Natallia Kokash, "An introduction to heuristic algorithms", published by Department of Informatics and Telecommunications, University of Trento, Italy, pp. 1-8 (Year: 2005).*

Yin et al., English translation of CN105718245A, Jun. 29, 2016, pp. 1-21 (Year: 2016).*

International searching report of parent application PCT/CN2021/078941, published Jun. 23, 2023, pp. 1-6 (Year: 2023).*

Alle et al., "Compiling Techniques for Coarse Grained Runtime Reconfigurable Architectures", published by International Workshop on Applied Reconfigurable Computing, ARC2009, p. 204-215 (Year: 2009).*

Lattner et al., "LLVM: A Compilation Framework for Lifelong Program Analysis & Transformation", published by IEEE Computer Society, Proceedings of the International Symposium on Code Generation and Optimization (CGO'04), p. 1-12 (Year: 2004).*

* cited by examiner

MEMORY COUPLED COMPILING METHOD AND SYSTEM OF RECONFIGURABLE CHIP

CROSS-REFERENCE TO RELATED APPLICATIONS

This application is a continuation of International Application No. PCT/CN2021/078941, filed Mar. 3, 2021, which claims priority to and benefits of Chinese Patent Application No. 202011554667.8, filed on Dec. 24, 2020, the entire contents of which are incorporated herein by reference.

FIELD

The present disclosure relates to the development of a reconfigurable processor, which is applicable to a reconfigurable compiler and its compilation process, more particularly to a memory coupled compiling method and system of a reconfigurable chip.

BACKGROUND

In the compilation process based on a low level virtual machine (LLVM) compilation framework for a compiler of a typical reconfigurable processor CGRA (Coarse-grained Reconfigurable Architecture), a user's application is analyzed through lexical, grammatical and semantic analysis commonly used at a frontend of the LLVM compilation framework of a reconfigurable compiler, an intermediate representation (IR) is optimized, and then a suitable data flow graph (DFG, also referred to as data flow diagram DFD) is extracted, and binary configuration information (Context Bitstream) of the application that needs to be computed rapidly on the reconfigurable processor hardware is generated after the task division, storage allocation, operator scheduling and mapping works, etc., and finally the binary executable file compiled by a general-purpose processor RISC-V cross-compiles a link to generate a final complete file executable by the reconfigurable processor hardware system, which includes not only binary instruction information of traditional serial or control software code to be executed by the main control processor, but also binary configuration information of hardware acceleration code to be executed on the reconfigurable processor unit.

At present, a programming model uses the reconfigurable processor to compile commonly used high-level software programming languages (such as C/C++), in which the software and hardware tasks are partitioned by the programmer using tags, such as #pragma before the codes that need to be accelerated by reconfigurable processor hardware, and then reconfigurable configuration information of the corresponding acceleration code is generated through a compiling process. Among them, mapping and memory access are important factors of the compiler, but they are vaguely used and even cannot be correctly used in the existing compilation schemes.

SUMMARY

According to a first aspect of the present disclosure, a memory coupled compiling method of a reconfigurable chip is provided. The memory coupled compiling method includes: acquiring a cycle number of a data flow graph; acquiring a linear transformation vector of the cycle number through a mapping time difference; determining whether a linear array of the linear transformation vector is acquired by a heuristic algorithm; acquiring a memory mapping result through a current data flow graph if the linear array of the linear transformation vector is acquired by the heuristic algorithm; and adjusting the current data flow graph and acquiring a cycle number of the current data flow graph until the linear array is acquired, if the linear array of the linear transformation vector is not acquired by the heuristic algorithm.

In an embodiment of the present disclosure, the adjusting the current data flow graph and acquiring the cycle number of the current data flow graph includes: adjusting nodes in the data flow graph based on a principle that a cycle number of a longest path is unchanged to acquire the current data flow graph.

In an embodiment of the present disclosure, the adjusting nodes in the data flow graph based on a principle that a cycle number of a longest path is unchanged to acquire the current data flow graph includes: determining whether a node that makes the cycle number of the longest path unchanged exists in the data flow graph; adjusting the nodes in the data flow graph based on the principle that the cycle number of the longest path is unchanged to acquire the current data flow graph, if the node that makes the cycle number of the longest path unchanged exists in the data flow graph; adjusting the nodes in the data flow graph based on a principle that the cycle number of the longest path is increased by several cycles to acquire the current data flow graph, if the node that makes the cycle number of the longest path unchanged does not exist in the data flow graph.

In an embodiment of the present disclosure, the acquiring the cycle number of the data flow graph includes: acquiring the data flow graph by processing arrays to be computed in a dependency analysis pass implemented in Clang and LLVM compiler framework; and acquiring the cycle number of the data flow graph according to a cycle number of a load node and a store node in the data flow graph.

In an embodiment of the present disclosure, the heuristic algorithm is expressed as:

$$gcd(\vec{\alpha} * \Delta_0^T, \vec{\alpha} * \Delta_1^T, \ldots, \vec{\alpha} * \Delta_{l-1}^T, N)?\vec{\alpha} * \Delta_l^T$$

where $\vec{\alpha}$ represents a linear vector; T represents transposition; l represents a dimensionality of an array; gcd represents a greatest common divisor; N represents the number of banks; $\Delta$ represents a difference; and ? represents questioning whether an intersection exists and determining whether a condition is met.

According to a second aspect of the present disclosure, a memory coupled compiling system of a reconfigurable chip is provided. The memory coupled compiling system includes: an acquiring unit, configured to acquire a cycle number of a data flow graph; a linear transformation vector acquiring unit, configured to acquire a linear transformation vector of the cycle number through a mapping time difference; and a determining unit, configured to determine whether a linear array of the linear transformation vector is acquired by a heuristic algorithm; and acquire a memory mapping result through a current data flow graph if the linear array of the linear transformation vector is acquired by the heuristic algorithm; or adjust the current data flow graph and acquire a cycle number of the current data flow graph until the linear array is acquired, if the linear array of the linear transformation vector is not acquired by the heuristic algorithm.

In an embodiment of the present disclosure, the determining unit adjusts the current data flow graph and acquires the cycle number of the current data flow graph by: adjusting nodes in the data flow graph based on a principle that a cycle number of a longest path is unchanged to acquire the current data flow graph.

In an embodiment of the present disclosure, the adjusting nodes in the data flow graph based on a principle that a cycle number of a longest path is unchanged to acquire the current data flow graph includes: determining whether a node that makes the cycle number of the longest path unchanged exists in the data flow graph; adjusting the nodes in the data flow graph based on the principle that the cycle number of the longest path is unchanged to acquire the current data flow graph, if the node that makes the cycle number of the longest path unchanged exists in the data flow graph; adjusting the nodes in the data flow graph based on a principle that the cycle number of the longest path is increased by several cycles to acquire the current data flow graph, if the node that makes the cycle number of the longest path unchanged does not exist in the data flow graph.

In an embodiment of the present disclosure, the acquiring unit is further configured to: acquire the data flow graph by processing arrays to be computed in a dependency analysis pass implemented in Clang and LLVM compiler framework; and acquire the cycle number of the data flow graph according to a cycle number of a load node and a store node in the data flow graph.

In an embodiment of the present disclosure, the heuristic algorithm is expressed as:

$$gcd(\vec{\alpha}*\Delta_0^T, \vec{\alpha}*\Delta_1^T, \ldots, \vec{\alpha}*\Delta_{l-1}^T, N)?\vec{\alpha}*\Delta_l^T$$

where $\vec{\alpha}$ represents a linear vector; T represents transposition; l represents a dimensionality of an array; gcd represents a greatest common divisor; N represents the number of banks; $\Delta$ represents a difference; and ? represents questioning whether an intersection exists and determining whether a condition is met.

According to a third aspect of the present disclosure, there is provided a non-transitory computer-readable storage medium having stored therein instructions that, when executed by a processor, cause the memory coupled compiling method as described in the first aspect of the present disclosure to be performed.

The characteristics, technical features, advantages and implementations of the memory coupled compiling method and system of the reconfigurable chip will be further illustrated below in a clear and understandable manner with reference to the accompanying drawings

DETAILED DESCRIPTION

Figure 1:
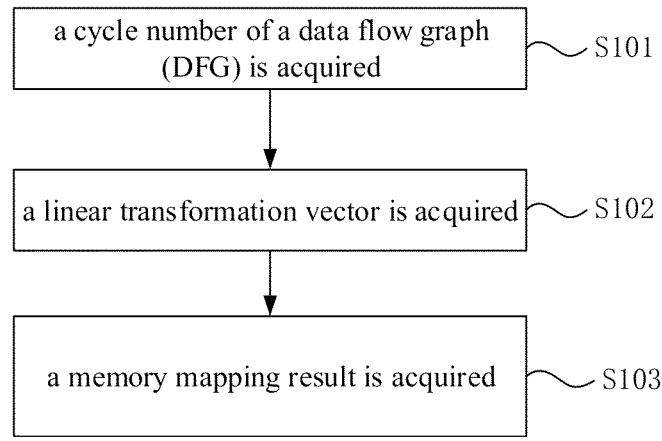
FIG. 1 is a flow chart for illustrating a memory coupled compiling method of a reconfigurable chip according to an embodiment of the present disclosure.

For a clearer understanding of the technical features, objectives and effects of the present disclosure, some specific embodiments of the present disclosure will now be illustrated below with reference to the accompanying drawings, in which the same or similar elements and elements having same or similar functions are denoted by like reference numerals.

It is to be understood that the expression "exemplary" used herein means the related embodiments serve as "examples or explanations", and any exemplary figure and embodiment described herein cannot be construed as a preferred implementation or a more advantageous implementation. To make the drawings concise, only parts related to the exemplary embodiments are schematically shown in the drawings, and they do not represent actual structures and true proportions of products.

An objective of the present disclosure is to provide a memory coupled compiling method of a reconfigurable chip, which is capable of acquiring a linear array by adjusting various nodes in a data flow graph (DFG), thereby greatly reducing the compiling time and giving users a better compiling experience. Further, the memory coupled compiling method according to embodiments of the present disclosure has high practicability, which not only makes a reconfigurable accelerator chip available, but also has high reusability for a programmable device.

Another objective of the present disclosure is to provide a memory coupled compiling system of a reconfigurable chip, which greatly reduces the compiling time and gives users a better compiling experience. Further, the memory coupled compiling system according to embodiments of the present disclosure has high practicability, which not only makes a reconfigurable accelerator chip available, but also has high reusability for a programmable device.

Yet another objective of the present disclosure is to provide a non-transitory computer-readable storage medium having stored therein instructions that, when executed by a processor, cause the memory coupled compiling method to be performed.

In a first aspect, embodiments of the present disclosure provide a memory coupled compiling method of a reconfigurable chip. As shown in FIG. 1, the memory coupled compiling method of the reconfigurable chip includes the following steps.

At step S101, a cycle number of a data flow graph (DFG) is acquired.

In this step, a DFG of an array to be computed is acquired. The cycle number of the DFG is acquired according to the DFG At step S102, a linear transformation vector is acquired.

In this step, a linear transformation vector of the cycle number is acquired through a mapping time difference.

At step S103, a memory mapping result is acquired.

In this step, it is determined whether a linear array of the linear transformation vector is acquired by a heuristic algorithm. If the linear array of the linear transformation vector is acquired by the heuristic algorithm, a memory mapping result is acquired through a current DFG If the linear array of the linear transformation vector is not acquired by the heuristic algorithm, the current DFG is adjusted and then return to the step S101 until the linear array is acquired.

In an embodiment of the memory coupled compiling method according to the present disclosure, adjusting the current DFG and returning to the step S101 as described in the step S103 includes: adjusting nodes in the DFG based on a principle that a cycle number of a longest path is unchanged to acquire the current DFG In other words, the nodes in the DFG are adjusted to acquire the current DFG while keeping the cycle number of the longest path unchanged.

In another embodiment of the memory coupled compiling method according to the present disclosure, adjusting nodes in the DFG based on the principle that the cycle number of the longest path is unchanged to acquire the current DFG further includes: determining whether a node that makes the cycle number of the longest path unchanged exists in the DFG; adjusting the nodes in the DFG based on the principle that the cycle number of the longest path is unchanged to acquire the current DFG, if the node that makes the cycle number of the longest path unchanged exists in the DFG; adjusting the nodes in the DFG based on a principle that the cycle number of the longest path is increased by several cycles to acquire the current DFG, if the node that makes the cycle number of the longest path unchanged does not exist in the DFG. In other words, when the node that makes the cycle number of the longest path unchanged does not exist in the DFG, the cycle number of the longest path is increased by several cycles, the nodes in the DFG is adjusted to acquire the current DFG.

In yet another embodiment of the memory coupled compiling method according to the present disclosure, the step S101 further includes: acquiring the data flow graph by processing arrays to be computed in a dependency analysis pass implemented in Clang and LLVM compiler framework; and acquiring the cycle number of the DFG according to a cycle number of a load node and a store node in the DFG.

In another embodiment of the memory coupled compiling method according to the present disclosure, the heuristic algorithm is expressed as formula (1):

$$gcd(\vec{\alpha}*\Delta_0^T, \vec{\alpha}*\Delta_1^T, \ldots, \vec{\alpha}*\Delta_{l-1}^T, N)?\vec{\alpha}*\Delta_l^T, \quad (1)$$

where $\vec{\alpha}$ represents a linear vector; T represents transposition; l represents a dimensionality of an array; gcd represents a greatest common divisor; N represents the number of banks; Δ represents a difference; and ? represents questioning whether an intersection exists and determining whether a condition is met.

Figure 2:
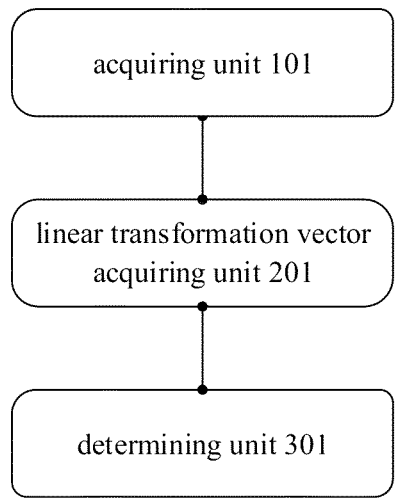
FIG. 2 is a block diagram for illustrating a memory coupled compiling system of a reconfigurable chip according to an embodiment of the present disclosure.

In a second aspect, as shown in FIG. 2, embodiments of the present disclosure provide a memory coupled compiling system of a reconfigurable chip. The memory coupled compiling system includes an acquiring unit 101, a linear transformation vector acquiring unit 201 and a determining unit 301.

The acquiring unit 101 is configured to acquire a cycle number of a DFG.

The linear transformation vector acquiring unit 201 is configured to acquire a linear transformation vector of the cycle number through a mapping time difference.

The determining unit 301 is configured to determine whether a linear array of the linear transformation vector is acquired by a heuristic algorithm; and acquire a memory mapping result through a current DFG if the linear array of the linear transformation vector is acquired by the heuristic algorithm; or adjust the current DFG and then return to the acquiring unit 101 until the linear array is acquired, if the linear array of the linear transformation vector is not acquired by the heuristic algorithm.

In an embodiment of the memory coupled compiling system according to the present disclosure, the determining unit 301 adjusts the current DFG and then return to the acquiring unit 101 by: adjusting nodes in the DFG based on a principle that a cycle number of a longest path is unchanged to acquire the current DFG.

In another embodiment of the memory coupled compiling system according to the present disclosure, the adjusting nodes in the DFG based on the principle that the cycle number of the longest path is unchanged to acquire the current DFG includes: determining whether a node that makes the cycle number of the longest path unchanged exists in the DFG; adjusting the nodes in the DFG based on the principle that the cycle number of the longest path is unchanged to acquire the current DFG, if the node that makes the cycle number of the longest path unchanged exists in the DFG; adjusting the nodes in the DFG based on a principle that the cycle number of the longest path is increased by several cycles to acquire the current DFG; if the node that makes the cycle number of the longest path unchanged does not exist in the DFG In yet another embodiment of the memory coupled compiling system according to the present disclosure, the acquiring unit 101 is further configured to: acquire the data flow graph by processing arrays to be computed in a dependency analysis pass implemented in Clang and LLVM compiler framework; and acquire the cycle number of the DFG according to a cycle number of a load node and a store node in the DFG In another embodiment of the memory coupled compiling system according to the present disclosure, the heuristic algorithm is expressed as a formula (2):

$$gcd(\vec{\alpha}*\Delta_0^T, \vec{\alpha}*\Delta_1^T, \ldots, \vec{\alpha}*\Delta_{l-1}^T, N)?\vec{\alpha}*\Delta_l^T, \quad (2)$$

where $\vec{\alpha}$ represents a linear vector; T represents transposition; l represents a dimensionality of an array; gcd represents a greatest common divisor; N represents the number of banks; Δ represents a difference; and ? represents questioning whether an intersection exists and determining whether a condition is met.

As an embodiment of the memory coupled compiling method according to the present disclosure, the memory coupled compiling method of the reconfigurable chip includes the following contents.

CGRA usually consists of a master controller (i.e., a central processing unit, CPU for short), a processing element (PE) array, a main memory, and a local memory. An executing flow of the CGRA computing system is as follows. First, the CPU initializes a CGRA instruction and input data into the main memory. Before the CGRA accelerates a kernel, the input data should be transferred from the main memory to the local memory, and the instruction should be loaded into a configuration memory of the CGRA.

When CGRA completes the computation, output data will be transferred from the local memory to the main memory. The processes that affect the overall performance include a data transmission task and a CGRA computing task. The existing methods only optimize the CGRA computing part, while the method of the present disclosure seeks to improve the entire CGRA computing process.

In the reconfigurable processor, the reconfigurable processing element array (PEA) responsible for task processing is mainly controlled by reconfigurable configuration information, and a controller is configured to be responsible for the load and distribution of the specific configuration information. The entire reconfigurable PEA shares a controller, and the controller is responsible for generating a common configuration address and configuration sequence for all PEs. The configuration function switching cycle of the entire PEA is long, which affects the dynamic reconfiguration and practicality of the reconfigurable processor. Although the function corresponding to each PE may be different, each PE cannot control its own executing process. In the reconfigurable elements, each PE is controlled strictly according to the execution cycle, for example, the execution cycle number of the Load element is 5, the execution cycle number of the Store element is 5, and the execution cycle number of alu is 2.

The following example code 1 shows an example of a program that accesses the same array program multiple times.

```
#include <stdlib.h>
int main( ) {
    const s32_t frame_size = 200;
    s32_t frame[200];
    s32_t frame_verify[200];
    s32_t coef = 15;
    s32_t Q_coef = 3;
    #pragma cgra map (to:coef, Q_coef, frame_size) map(tofrom:
    frame[0:200])
        for (int i = frame_size - 1; i > 1; i--) {
            s32_t tmp = ((s32_t)frame[i - 1] * coef) >> Q_coef;
            tmp = MED3(MIN_Q15, tmp, MAX_Q15);
            tmp = (s32_t)frame[i] - tmp;
            frame[i] = MED3(MIN_Q15, tmp, MAX_Q15);
        }
}
```

Figure 3:
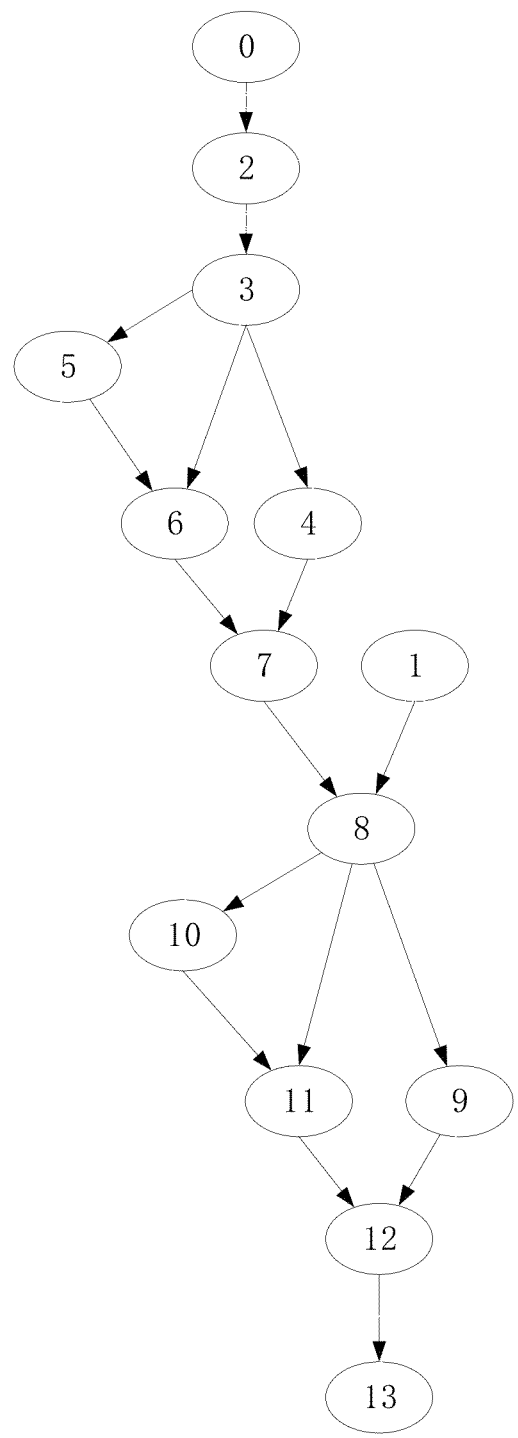
FIG. 3 is a schematic diagram for illustrating a data flow graph of an example code 1 according to another embodiment of the present disclosure.

FIG. 3 shows a DFG analyzed by the reconfigurable compiler through the Clang frontend and LLVM based on the DDG, including the flow chart of all computations. The DFG node makes '0' correspond to frame[i−1], '1' correspond to frame[i] and '13' correspond to frame[i]. The startup cycle number of the node '0' is 0, the startup cycle number of the node '1' is 10, and the startup cycle number of the node '13' is 23. In order to streamline the loop, the three elements ('0', '1', '13') will be accessed simultaneously in each clock cycle.

In this solution, conflicts will occur in each cycle, because for each iteration, the load and store operations corresponding to '1' and that corresponding to '13' cannot be merged simply, and conflicts will occur in the same bank (load frame[i] and store frame[i]), which will seriously affect the program running.

The mapping and memory of the reconfigurable processor compiler affects each other, and the adjustment of a topological structure of a memory array will cause the time differences of the DFG nodes mismatch, which will affect whether it needs to supplement a route node and insert a global register for mapping. In return, the new timing clock generated after the mapping will affect the topological structure of the memory. If the topological structure is unreasonable and cannot meet a banking structure of hardware, then the mapping adjustment process needs to be repeated, while the mapping consumes a lot of CPU time of the compiler, resulting in too long compiling time and affecting the development efficiency of users.

In the present disclosure, the conflict accessing manner between mapping and memory is adjusted. In the method according to embodiments of the present disclosure, a mapping code will be executed first, and then the cycle number of each load node and store node will be computed using the mapping code, the generated cycle number will be added to the topological structure of the memory, and then try to find a reasonable memory allocation mechanism. If the reasonable memory allocation mechanism can be found, a banking coefficient obtained thereby will be used.

If a suitable parameter cannot be found to avoid the memory conflict, the DFG will be adjusted based on the memory conflict feedback, a route node will be inserted in the DFG to make dynamical adjustment, and finally the dynamically adjusted DFG with the route node will be remapped.

Figure 4:
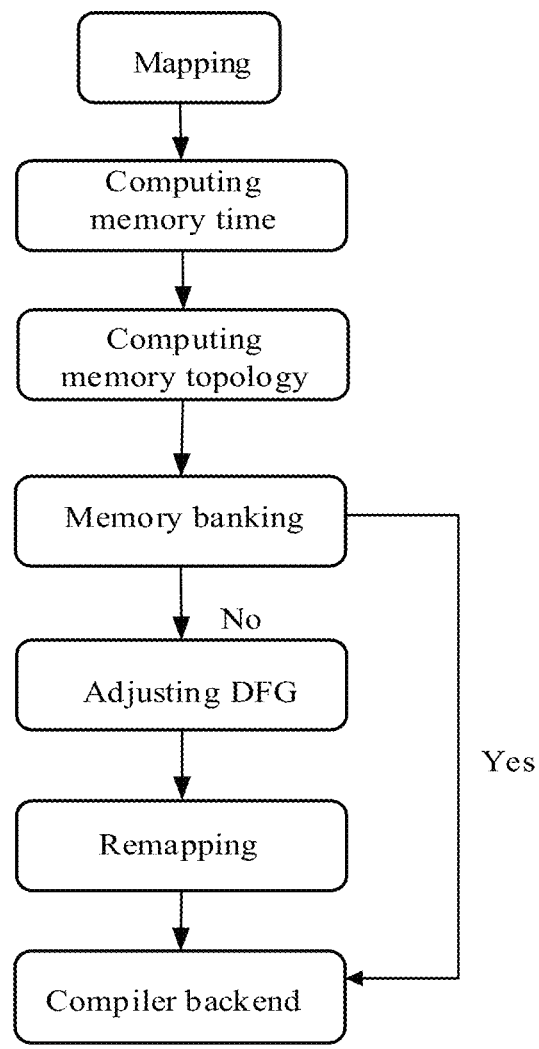
FIG. 4 is a flow chart for illustrating a compiling process according to an embodiment of the present disclosure.

This method requires only two mappings at most and a banking strategy to meet the design requirements, and the flow chart is as shown in FIG. 4.

A memory banking mathematical model is established, and the core of the memory banking algorithm is the heuristic algorithm. The established mathematical model is as follows:

$$R_0 = \begin{pmatrix} a_{0,0} & \cdots & a_{0,l} \\ \vdots & \ddots & \vdots \\ a_{d-1,0} & \cdots & a_{d-1,l} \end{pmatrix} * (i_0, i_1, \ldots i_{l-1}, 1)^T \quad [0]$$

$$R_1 = \begin{pmatrix} b_{0,0} & \cdots & b_{0,l} \\ \vdots & \ddots & \vdots \\ b_{d-1,0} & \cdots & b_{d-1,l} \end{pmatrix} * (i_0, i_1, \ldots i_{l-1}, 1)^T \quad [1]$$

$$f(R_0)(\vec{\alpha} * R_0)\% \ N \quad f(R_1) = (\vec{\alpha} * R_1)\% \ N \quad [2]$$

$$gcd(\vec{\alpha} * \Delta_0^T, \vec{\alpha} * \Delta_1^T, \ldots, \vec{\alpha} * \Delta_{l-1}^T, N) \dagger \vec{\alpha} * \Delta_l^T, \quad [3]$$

where $\vec{\alpha}$ represents a linear vector; T represents transposition; l represents a dimensionality of an array; gcd represents a greatest common divisor; N represents the number of banks; Δ represents a difference; and ? represents questioning whether an intersection exists and determining whether a condition is met.

According to the mathematical model [1], for the above example code 1, new topological structures are established for the frame[i−1], frame[i], frame[i] arrays according to the mapping time difference: R0=(1, 0); R1=(1, −11); R2=(1, −24), and an alternative $\vec{\alpha}$ set for reconfigurable processor hardware resources is generated according to the heuristic algorithm, and then each two of the generated topological structures are solved using the formula [3] for the $\vec{\alpha}$, and finally it concludes that 16 banks are needed to avoid the memory accessing conflict, and there is no need to adjust the positions of the load node and store node in the DFG.

If adjustment needs to be made for a special case, it is necessary to determine whether the load node and store node on the longest path meet the memory design requirements; If yes, the branch load and store may be adjusted by using a multi-objective genetic algorithm; if no, different time points needs to be inserted in the nodes of the longest path, and the solving action is repeated until a time difference that meets the design requirements is found, and then DFG is adjusted according to this time difference to finally obtain the mapping result.

In a third aspect of the present disclosure, there is provided in embodiments a non-transitory computer-readable storage medium having stored therein instructions that, when executed by a processor, cause the memory coupled compiling method as described in the first aspect of the present disclosure to be performed.

Therefore, the beneficial effects of embodiments of the present disclosure are that the compiling time is greatly reduced, and the user's compiling experience is better Different strategy modes are used, such that the problem that compilation cannot be performed due to the coupling and correlation between the mapping and memory will not occur. The memory coupled compiling method and system have high practicability, which not only make a reconfigurable accelerator chip available, but also have high reusability for a programmable device.

It should be understood that although the present disclosure is described with reference to the above embodiments, not every embodiment only includes an independent technical solution. The description manner of the specification is only for clarity and ease of understanding, those skilled in the art should regard the specification as a whole, and embodiments or the technical features described therein can also be appropriately combined to form other embodiments that can be understood by those skilled in the art.

The above detailed descriptions are only directed to some implementations of the present disclosure, which are explanatory and illustrative, and cannot be construed to limit the present disclosure, and it would be appreciated by those skilled in the art that changes, alternatives, and modifications can be made in the embodiments without departing from spirit and principles of the present disclosure, which also falls within the scope of the present disclosure.

What is claimed is:

1. A memory coupled compiling method of a reconfigurable chip, comprising:
    acquiring a data flow graph by processing arrays to be computed in a dependency analysis pass implemented in Clang and low level virtual machine (LLVM) compiler framework;
    acquiring a cycle number of the data flow graph according to a cycle number of a load node and a store node in the data flow graph;
    acquiring a linear transformation vector of the cycle number of the data flow graph through a mapping time difference;
    determining whether a linear array of the linear transformation vector is acquired by a heuristic algorithm;
    acquiring a memory mapping result through a current data flow graph if the linear array of the linear transformation vector is acquired by the heuristic algorithm;
    adjusting the current data flow graph and acquiring a cycle number of the current data flow graph until the linear array is acquired, if the linear array of the linear transformation vector is not acquired by the heuristic algorithm; and
    performing compilation for the reconfigurable chip by a backend compiler based on the acquired memory mapping result, or the acquired cycle number of the current data flow graph.

2. The memory coupled compiling method according to claim 1, wherein the adjusting the current data flow graph and acquiring the cycle number of the current data flow graph comprises:
    adjusting nodes in the data flow graph based on a principle that a cycle number of a longest path is unchanged to acquire the current data flow graph.

3. The memory coupled compiling method according to claim 2, wherein the adjusting nodes in the data flow graph based on the principle that the cycle number of the longest path is unchanged to acquire the current data flow graph comprises:
    determining whether a node that makes the cycle number of the longest path unchanged exists in the data flow graph;
    adjusting the nodes in the data flow graph based on the principle that the cycle number of the longest path is unchanged to acquire the current data flow graph, if the node that makes the cycle number of the longest path unchanged exists in the data flow graph; and
    adjusting the nodes in the data flow graph based on a principle that the cycle number of the longest path is increased by several cycles to acquire the current data flow graph, if the node that makes the cycle number of the longest path unchanged does not exist in the data flow graph.

4. A non-transitory computer-readable storage medium having stored therein instructions that, when executed by a processor, cause the memory coupled compiling method according to claim 3 to be performed.

5. A non-transitory computer-readable storage medium having stored therein instructions that, when executed by a processor, cause the memory coupled compiling method according to claim 2 to be performed.

6. The memory coupled compiling method according to claim 1, wherein the heuristic algorithm is expressed as:

$$gcd(\vec{\alpha}*\Delta_0^T, \vec{\alpha}*\Delta_1^T, \ldots, \vec{\alpha}*\Delta_{l-1}^T, N)?\vec{\alpha}*\Delta_l^T$$

where $\vec{\alpha}$ represents a linear vector; T represents transposition; l represents a dimensionality of an array; gcd represents a greatest common divisor; N represents a number of banks; $\Delta$ represents a difference; and ? represents questioning whether an intersection exists and determining whether a condition is met.

7. A non-transitory computer-readable storage medium having stored therein instructions that, when executed by a processor, cause the memory coupled compiling method according to claim 6 to be performed.

8. A non-transitory computer-readable storage medium having stored therein instructions that, when executed by a processor, cause the memory coupled compiling method according to claim 1 to be performed.

9. A memory coupled compiling system of a reconfigurable chip, comprising a processor and a memory storing instructions which, when executed by the processor, cause the processor to:
    acquire a data flow graph by processing arrays to be computed in a dependency analysis pass implemented in Clang and low level virtual machine (LLVM) compiler framework;
    acquire a cycle number of the data flow graph according to a cycle number of a load node and a store node in the data flow graph;
    acquire a linear transformation vector of the cycle number of the data flow graph through a mapping time difference;
    determine whether a linear array of the linear transformation vector is acquired by a heuristic algorithm;
    acquire a memory mapping result through a current data flow graph if the linear array of the linear transformation vector is acquired by the heuristic algorithm; or adjust the current data flow graph and acquire a cycle number of the current data flow graph until the linear array is acquired, if the linear array of the linear transformation vector is not acquired by the heuristic algorithm; and performing compilation for the reconfigurable chip by a backend compiler based on the acquired memory mapping result, or the acquired cycle number of the current data flow graph.

10. The memory coupled compiling system according to claim 9, wherein the processor is configured to adjust the current data flow graph and acquire the cycle number of the current data flow graph by:

adjusting nodes in the data flow graph based on a principle that a cycle number of a longest path is unchanged to acquire the current data flow graph.

11. The memory coupled compiling system according to claim 10, wherein the adjusting nodes in the data flow graph based on the principle that the cycle number of the longest path is unchanged to acquire the current data flow graph comprises:

determining whether a node that makes the cycle number of the longest path unchanged exists in the data flow graph;

adjusting the nodes in the data flow graph based on the principle that the cycle number of the longest path is unchanged to acquire the current data flow graph, if the node that makes the cycle number of the longest path unchanged exists in the data flow graph; and adjusting the nodes in the data flow graph based on a principle that the cycle number of the longest path is increased by several cycles to acquire the current data flow graph, if the node that makes the cycle number of the longest path unchanged does not exist in the data flow graph.

12. The memory coupled compiling system according to claim 9, wherein the heuristic algorithm is expressed as:

$$gcd(\vec{\alpha} * \Delta_0^T, \vec{\alpha} * \Delta_1^T, \ldots, \vec{\alpha} * \Delta_{l-1}^T, N) ? \vec{\alpha} * \Delta_l^T$$

where $\vec{\alpha}$ represents a linear vector; T represents transposition; l represents a dimensionality of an array; gcd represents a greatest common divisor; N represents a number of banks; $\Delta$ represents a difference; and ? represents questioning whether an intersection exists and determining whether a condition is met.

13. A memory coupled compiling method of a reconfigurable chip, comprising:

acquiring a cycle number of a data flow graph;

acquiring a linear transformation vector of the cycle number of the data flow graph through a mapping time difference;

determining whether a linear array of the linear transformation vector is acquired by a heuristic algorithm;

acquiring a memory mapping result through a current data flow graph if the linear array of the linear transformation vector is acquired by the heuristic algorithm;

adjusting the current data flow graph and acquiring a cycle number of the current data flow graph until the linear array is acquired, if the linear array of the linear transformation vector is not acquired by the heuristic algorithm, wherein the adjusting the current data flow graph and acquiring the cycle number of the current data flow graph comprises:

determining whether a node that makes a cycle number of a longest path unchanged exists in the data flow graph;

adjusting nodes in the data flow graph based on a principle that the cycle number of the longest path is unchanged to acquire the current data flow graph, if the node that makes the cycle number of the longest path unchanged exists in the data flow graph;

adjusting the nodes in the data flow graph based on a principle that the cycle number of the longest path is increased by several cycles to acquire the current data flow graph, if the node that makes the cycle number of the longest path unchanged does not exist in the data flow graph; and performing compilation for the reconfigurable chip by a backend compiler based on the acquired memory mapping result, or the acquired cycle number of the current data flow graph.

14. The memory coupled compiling method according to claim 13, wherein the heuristic algorithm is expressed as:

$$gcd(\vec{\alpha} * \Delta_0^T, \vec{\alpha} * \Delta_1^T, \ldots, \vec{\alpha} *, \Delta_{l-1}^T, N) ? \vec{\alpha} * \Delta_l^T$$

where $\vec{\alpha}$ represents a linear vector; T represents transposition; l represents a dimensionality of an array; god represents a greatest common divisor; N represents a number of banks; $\Delta$ represents a difference; and ? represents questioning whether an intersection exists and determining whether a condition is met.

15. A non-transitory computer-readable storage medium having stored therein instructions that, when executed by a processor, cause the memory coupled compiling method according to claim 14 to be performed.

16. A memory coupled compiling system of a reconfigurable chip comprising a processor and a memory storing instructions which, when executed by the processor, cause the processor to perform the method according to claim 14.

17. A non-transitory computer-readable storage medium having stored therein instructions that, when executed by a processor, cause the memory coupled compiling method according to claim 13 to be performed.

18. A memory coupled compiling system of a reconfigurable chip comprising a processor and a memory storing instructions which, when executed by the processor, cause the processor to perform the method according to claim 13.

* * * * *